United States Patent [19]
Korhonen et al.

[11] Patent Number: 5,329,191
[45] Date of Patent: Jul. 12, 1994

[54] INTEGRATED DYNAMIC AMPLITUDE LIMITER INDEPENDENT OF THE SUPPLY VOLTAGE

[75] Inventors: Pertti J. Korhonen; Kalle J. T. Korhonen, both of Oulu, Finland

[73] Assignee: Nokia Mobile Phones Ltd., Salo, Finland

[21] Appl. No.: 944,018

[22] Filed: Sep. 11, 1992

Related U.S. Application Data

[63] Continuation of Ser. No. 579,815, Sep. 4, 1990, abandoned.

[30] Foreign Application Priority Data

Sep. 19, 1989 [FI] Finland .................................. 894435

[51] Int. Cl.$^5$ ............................ H03K 5/08; H03K 5/02
[52] U.S. Cl. ........................... 307/540; 307/264; 307/359; 307/493; 307/555; 307/491
[58] Field of Search ............... 307/264, 359, 360, 491, 307/493, 540, 555

[56] References Cited

U.S. PATENT DOCUMENTS

| | | | |
|---|---|---|---|
| 3,879,672 | 4/1975 | Milanes | 307/264 |
| 4,334,185 | 6/1982 | Turney et al. | 307/264 |
| 4,382,198 | 5/1983 | Ishijima et al. | 307/360 |
| 4,453,258 | 6/1984 | Richardson . | |
| 4,542,349 | 9/1985 | Hoeft . | |
| 4,691,172 | 9/1987 | Fukahori et al. . | |
| 4,709,204 | 11/1987 | Hayakawa | 307/360 |
| 4,802,236 | 1/1989 | Walczak et al. . | |

FOREIGN PATENT DOCUMENTS

| | | |
|---|---|---|
| 0077266 | 4/1983 | European Pat. Off. . |
| 0126337 | 11/1984 | European Pat. Off. . |
| 0325252 | 7/1989 | European Pat. Off. . |
| 8603077 | 5/1986 | PCT Int'l Appl. . |

OTHER PUBLICATIONS

Gregorian et al., Analog MOS Integrated Circuit for Signal Processing, John Wiley & Sons, New York, 1986, pp. 412–425, 272–273 and 278–279.

Fotouhi et al., A Single-Chip High-Speed CMOS Analog Modem Front-End, IEEE Journal of Solid State Circuits, 1983, pp. 84–88.

Patent Abstracts of Japan, vol. 4, No. 87 (E-16)(569), Jul. 21, 1980 & JP-A-55 52 618 (Mitsubishi Precision K.K.).

Phillip E. Allen et al., CMOS Analog Circuit Design, published by Holt, Rinehart and Winston, Inc., 1987, p. 360.

Primary Examiner—John Zazworsky
Attorney, Agent, or Firm—Darby & Darby

[57] ABSTRACT

An integrated dynamic amplitude limiter is disclosed for limiting the deviation of a transmitter operating at audio frequencies. In an amplitude limiter according to the invention, a dynamic AGC amplifier block (1), a level clipper block (3) and a block (2) which forms the higher and lower limiting levels are implemented using switched capacitors (SC), and they are formed into an integrated amplitude limiter circuitry, and the voltages which define the higher and lower limiting levels are formed from the voltage of the band-gap voltage reference (Vbgref), which voltage is formed in relation to the virtual ground voltage of the amplifier circuitry, in which case the limiting levels are independent of the supply voltage (Vdd).

4 Claims, 3 Drawing Sheets

INTEGRATED DYNAMIC AMPLITUDE LIMITER INDEPENDENT OF THE SUPPLY VOLTAGE

This is a continuation of U.S. patent application Ser. No. 07/579,815, filed Sep. 4, 1990, now abandoned.

BACKGROUND OF THE INVENTION

The present invention relates to an amplitude limiter operating at audio frequencies, and it is particularly intended for a deviation limiter in a mobile telephone or a base station.

In the transmitter of a radio telephone, the amplitude of the input voltage of the FM modulator has to be limited in order to limit the frequency deviation of an FM-modulated signal. Signals of an excessively high level are clipped by a level clipper which limits the amplitudes of the signals to a level between a higher level and a lower level. A normal way of implementing the level clipper is to form limiting levels on the voltage divider directly from the supply voltage or to use a reference voltage formed in relation to the supply voltage.

This known method has the disadvantage that variations and disturbances in the supply voltage affect the reference voltages and thereby also directly the limiter output signal. In order to eliminate these disadvantages the disturbance components within a wide frequency range must be filtered out from the supply voltage, and efforts must be made to keep the absolute value of the supply voltage as stable as possible. This for its part will lead to the use of expensive precision components. Such specialized components include precision capacitors, precision resistors and a regulator, which have been used in prior-art mobile telephones and base stations implemented using, for example, an NE 571 circuit. However, it has been difficult to achieve sufficiently precise limiting levels and sufficiently precise build-up and decay times.

SUMMARY OF THE INVENTION

The object of the present invention is to make improvement to prior-art clippers and to provide an integrated dynamic amplitude limiter which is independent of the supply voltage and limits the amplitude of the input signal to a predetermined level so that variation and disturbances in the supply voltage will not be directly visible in the output signal.

The amplitude limiter according to the invention is characterized in that the voltages defining the higher and lower limiting levels are formed from the voltage of a band-gap voltage reference (Vbgref), which voltage is formed in relation to the virtual ground voltage of the amplifier circuitry, in which case the limiting level is independent of the supply voltage (Vdd). The virtual ground is common to the whole circuitry, and it is formed, for example, by dividing resistors from the supply voltage. The precision of the virtual ground does not affect the functioning of the circuitry.

The amplitude limiter according to the invention comprises a dynamic AGC (automatic gain control) amplifier and a level clipper subsequent to it. The circuitry is implemented by using switched capacitors (SC). These enable very precise limiting levels to be achieved in an integrated implementation. The basic circuitries of the AGC amplifier and the limiter amplifier, implemented by the SC technique, are known as separate circuits, but the integrated circuitry according to the invention is novel. Since the limiting levels are formed from a reference voltage which is formed in relation to the virtual ground voltage, it follows from this that the limiting circuitry functions independently of the voltage, and variations and disturbances in the supply voltage are not directly visible in the output signal.

DESCRIPTION OF THE PREFERRED EMBODIMENT

Figure 1A:
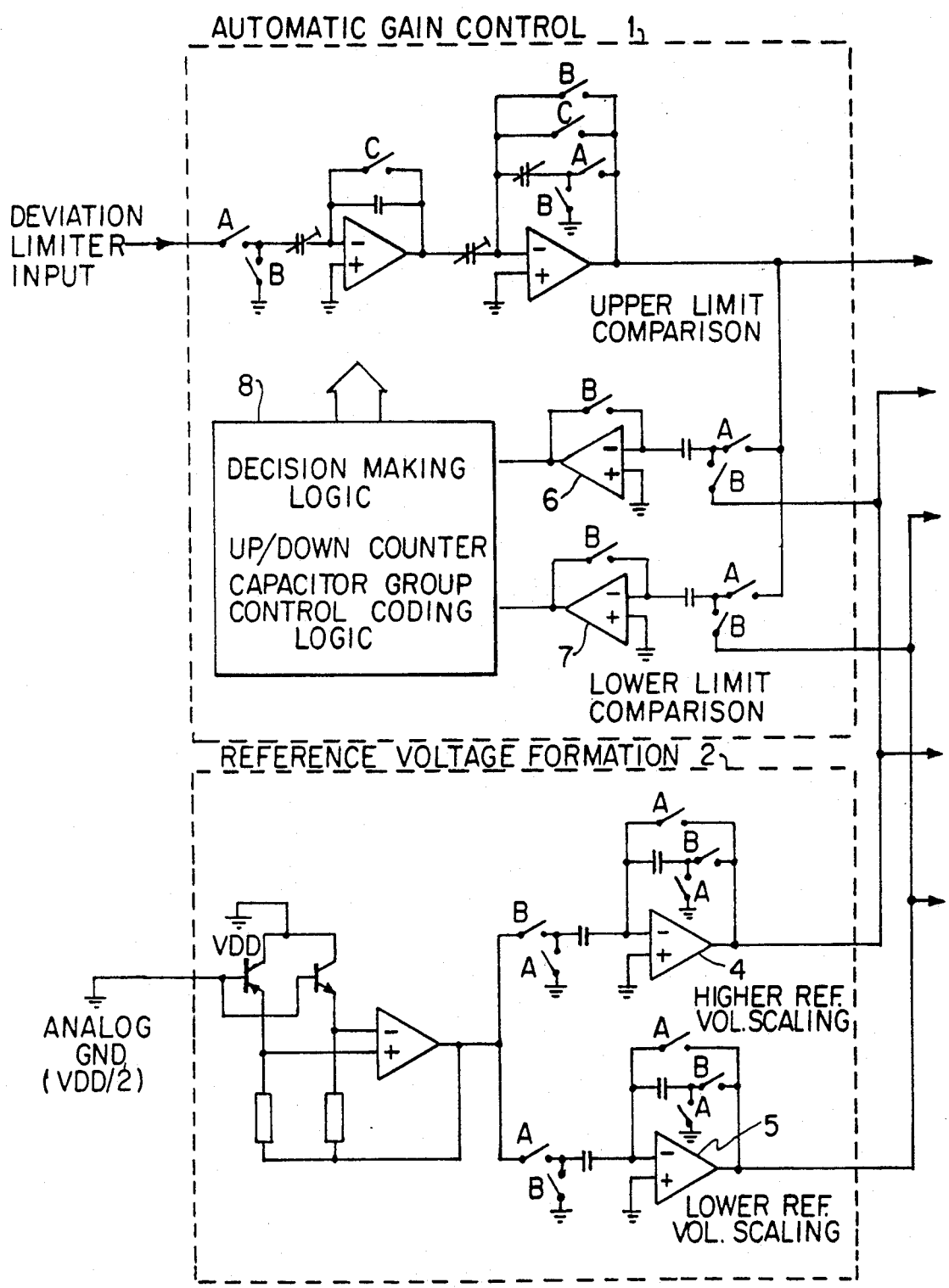
FIGS. 1A, 1B and 1C show one embodiment of the amplitude limiter according to the invention.
Figure 1B:
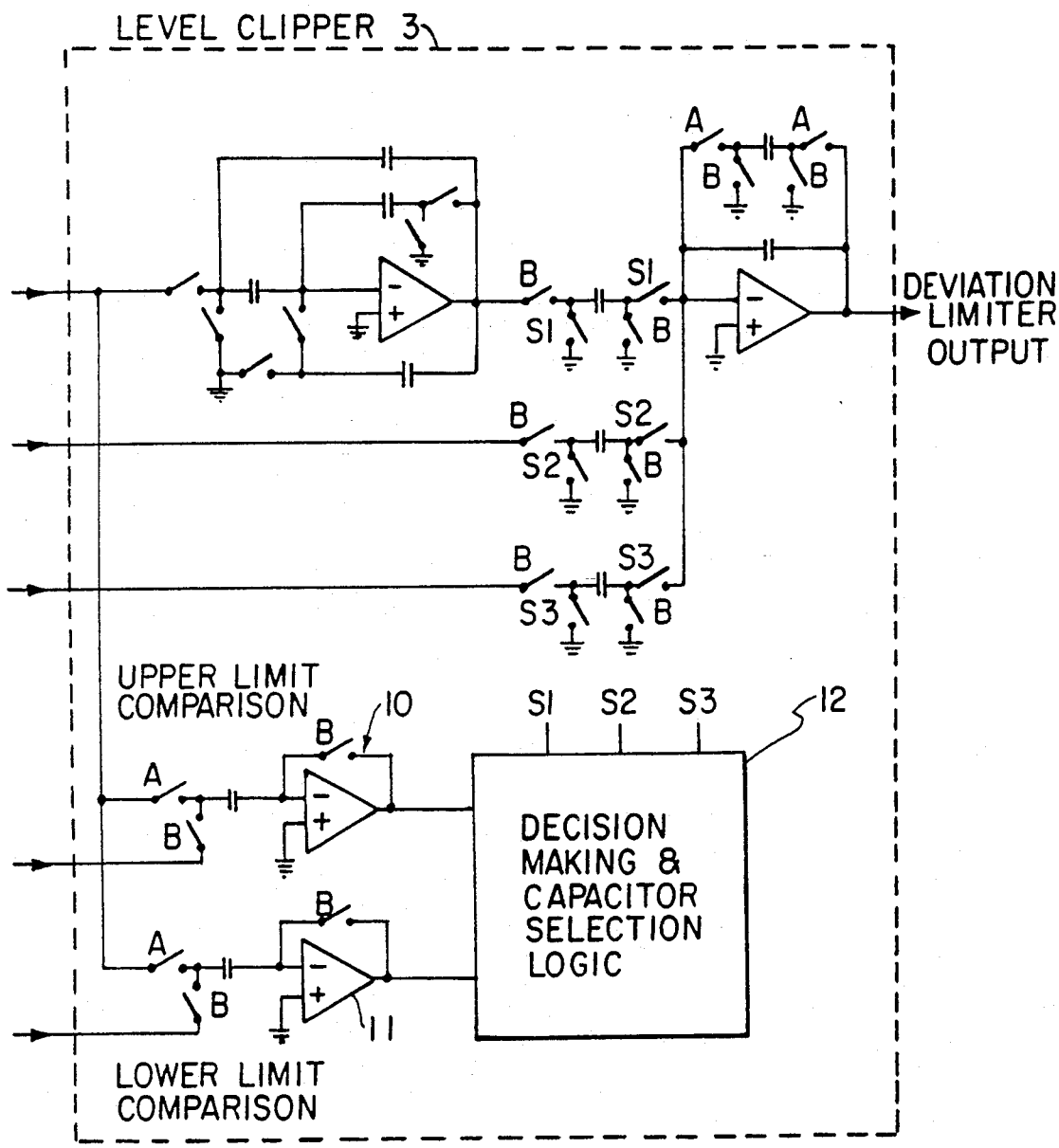
Figure 1C:
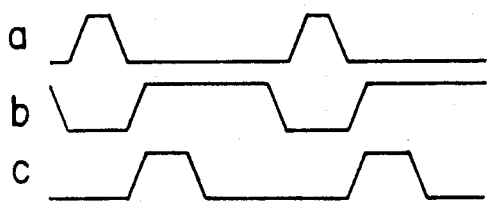

FIGS. 1A and 1B show that the amplitude limiter comprising three clearly distinguishable blocks; automatic gain control (AGC) 1; a reference voltage forming block 2; and a limiter or level clipper block 3. In the blocks, A, B and C indicate switched capacitors (SC) which are controlled by clock pulse forms a, b, c depicted in FIG. 1C.

The description of the operation begins from block 2. The band-gap reference circuit forms from the supply voltage Vdd and the virtual ground (Vdd/2) a voltage Vbgref, which is below the virtual ground by the extent of the band-gap reference voltage. It can be seen that the voltage difference between Vbgref and the virtual ground Vdd/2 is not dependent on the absolute value of the supply voltage Vdd as long as the supply voltage is sufficient for the functioning of the band-gap reference. Of course, the absolute value of Vbgref will change as the supply voltage Vdd changes, but this does not have significance, since according to the invention all the voltage samples in the capacitors are formed in relation to the virtual ground. From the voltage Vbgref the higher and lower reference voltages for the window comparator 6, 7 on the SC amplifier pair 4, 5 are formed so that the inverting amplifier stage 4 will form the reference voltage above the virtual ground and the non-inverting amplifier stage 5 will form the reference voltage below the virtual ground.

The window comparator 6, 7 compares the value of the output voltage of the AGC amplifier 9 with the higher and lower reference voltages obtained from the amplifiers 4, 5 of the reference voltage forming block 2 and controls the functioning of the up/down counter of block 8 so that it will increase or decrease the damping of the AGC amplifier if the level of the AGC output signal is outside or respectively inside the limits of the window. The rise and decay time constants of the AGC are determined directly on the basis of the clock frequencies of the up/down counter, and therefore they are very precise. They can also be made selectable, in which case the time constants can be changed according to the application. The functioning of the up/down counter is synchronized with the clocks of the AGC amplifier so that amplification will be adjusted only at the beginning of the offset-reset sequence, since adjustment during the amplifier operating sequence would cause strong disturbances to appear in the output of the AGC amplifier.

The level clipper block 3 takes a sample of the output voltage of the AGC amplifier and compares it with the reference levels by using the window comparator 10, 11. If the voltage is between the reference levels., it is applied directly to the output of the amplitude limiter. If the voltage is outside the reference limits, the corresponding reference voltage is applied directly to the output. The decision and the control of the switches S1, S2, S3 are carried out in the decision making and capacitor selection logic 12.

By the solution according to the invention, supply voltage variation and disturbances in the Output signal of the amplitude limiter are eliminated. The level of the signal depends on the supply voltage only to the extent of the PSR (power supply rejection) property and temperature dependence of the band-gap voltage reference. Typically the PSR is in the order of −20 ... −40 dB and the temperature dependence is in the order of 100-200 ppm/° C. Thus the supply voltage may vary, for example within the range 4-10V, without affecting the limiting properties of the proposed circuitry.

Figure 2:
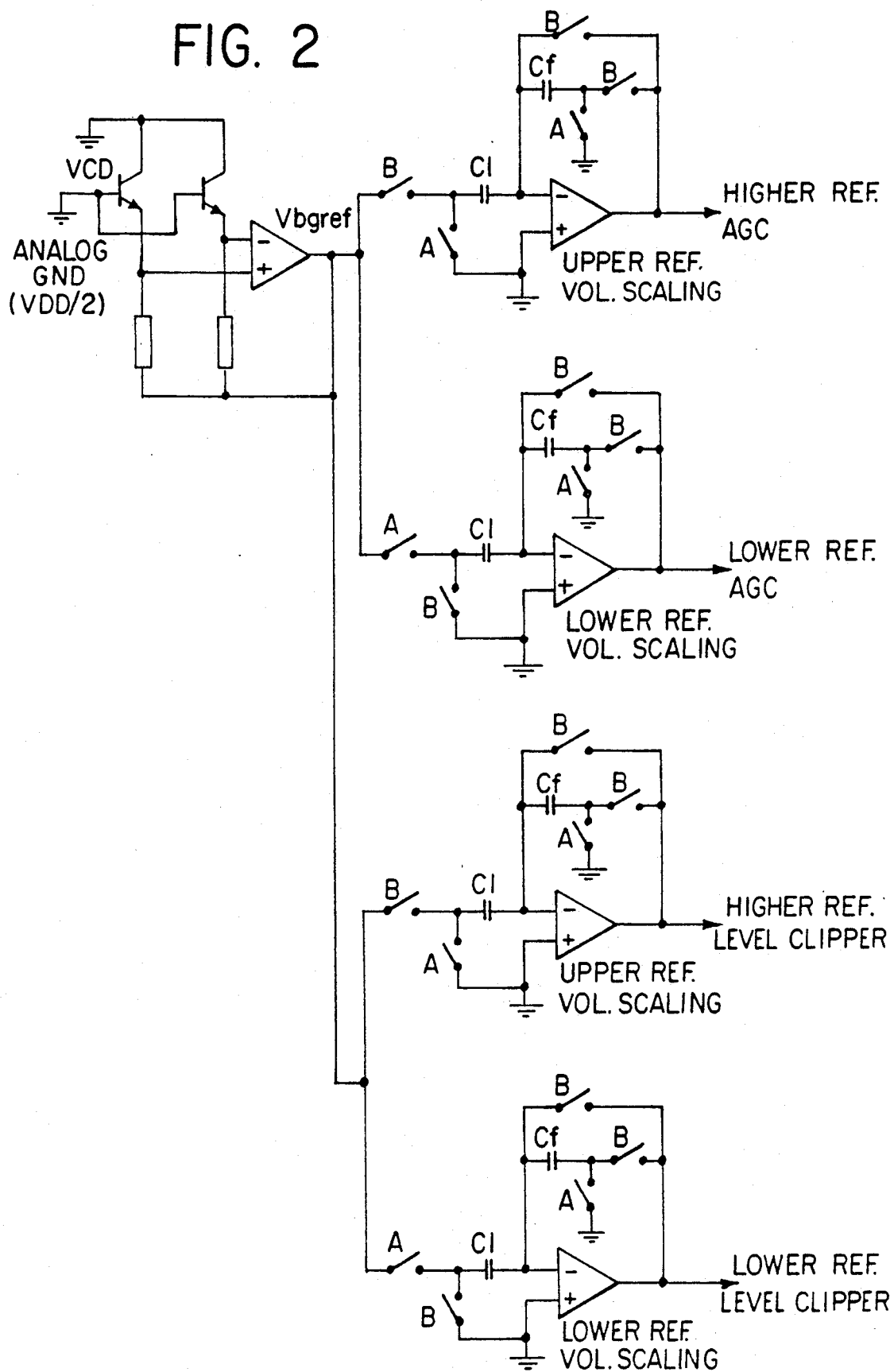
FIG. 2 shows another embodiment of the reference voltage formation block of FIG. 1A.

If it is desired that the operating level of the clipper block 3 be different from that of the automatic gain control circuit block 1, separate reference voltages must be formed for the clipper block (see FIG. 2), but if the same operating levels are used, it is possible to use common reference voltages, as described above.

The circuitry example described above can also be implemented in other ways within the scope of protection of the patent claims. Thus the control loop of the AGC amplifier can be implemented by using, for example, a combination of integrator +rectification+comparator+up/down counter, or in some other way evident.

The amplitude limiter according to the invention can well be integrated on a CMOS circuit, for example, together with filtering functions, since the SC technique is used in both. Since reference voltage of the circuit is formed in relation to the virtual ground level of the circuitry, an inexpensive regulator circuit can be used for forming the circuit supply voltages. The circuitry described can be used in all applications in which it is desired to make a CMOS-integrated dynamic amplitude limiter within an audio frequency range. A typical use is the deviation limiter in a mobile telephone or a base station.

We claim:

1. Amplitude limiter circuitry for limiting the amplitude of an input signal to provide a limited output which is limited to a predetermined level, the amplitude circuitry comprising:
   a dynamic automatic gain control (AGC) amplifier block (1) which receives the input signal and having an AGC amplifier with gain for producing an output voltage based on said gain;
   a level clipper block (3) including a clipper amplifier means with gain for making a comparison of the output voltage of the AGC amplifier block with respective voltages defining higher and lower limiting levels and producing the limited output based on the comparison and said gain of said clipper amplifier means;
   a limiting level forming circuit block (2) responsive to a supply voltage (Vdd) and a virtual ground voltage (Vdd/2) for forming a band-gap reference voltage (Vbgref), the limiting level forming circuit block including high and lower amplifier means which have gain for forming said higher and lower limiting levels based on the band-gap reference voltage (Vbgref) and being independent of the supply voltage (Vdd); and
   switched capacitor means for setting the gains of the AGC amplifier and, the clipper and the high and low amplifier means.

2. A circuitry according to claim 1, wherein the AGC amplifier block (1) has a window comparator (6, 7), receiving as inputs the output voltage of the AGC amplifier (9) and the respective voltages defining the higher and lower limiting levels of the limiting level forming circuit block (2) so as to compare output voltage of the AGC amplifier (9) with the respective voltages defining the higher and lower limiting levels, the AGC amplifier block further including an up/down counter receiving as inputs the outputs of the window comparator (6, 7) and outputting control signals to the AGC amplifier (9), the window comparator (6, 7) thereby controlling the up/down counter to increase or decrease a gain of the AGC amplifier so that the said output voltage will remain between the higher and lower limiting levels.

3. A circuitry according to claim 1, wherein the level clipper block (3) includes a window comparator (10, 11) receiving as inputs the output of the dynamic automatic gain control (AGC) amplifier block (1) and the respective voltages defining the higher and lower limiting levels of the limiting level forming circuit block (2) so as to compare the output voltage of the AGC amplifier with the voltages defining the higher and lower limiting levels, the level clipper block further including switches (S1, S2, S) and a decision making and capacitor selection circuit (12) receiving as inputs the outputs of the window comparator (10, 11) and outputting control signals to the switches, the window comparator (10, 11) thereby controlling the decision making and capacitor selection circuit (12) for directing by control of the switches the output voltage of the AGC amplifier as output of the amplitude limiter circuitry if a value of the output voltage of the AGC amplifier is between that of the voltages defining the higher and lower limiting levels, and for directing by control of the switches the voltage defining the higher limiting level as output of the amplitude limiter circuitry if the value of the output voltage of the AGC amplifier is higher than the voltage defining the higher limiting level, and for directing by control of the switches the voltage defining the lower limiting level as output of the amplitude limiter circuitry if the value of the output voltage of the AGC amplifier is lower than the voltage defining the lower limiting level.

4. A circuitry according to claim 2, wherein the respective voltages defining the higher and lower limiting levels are formed separately for the AGC amplifier block (1) and for the level clipper block (3).

* * * * *